(12) United States Patent
Lin

(10) Patent No.: US 12,294,377 B1
(45) Date of Patent: May 6, 2025

(54) LOW-NOISE SPEEDY DUTY CYCLE DETECTOR AND METHOD THEREOF

(71) Applicant: Realtek Semiconductor Corp., Hsinchu (TW)

(72) Inventor: Chia-Liang (Leon) Lin, Fremont, CA (US)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 83 days.

(21) Appl. No.: 18/503,227

(22) Filed: Nov. 7, 2023

(51) Int. Cl.
*H03K 5/156* (2006.01)

(52) U.S. Cl.
CPC ................................ *H03K 5/1565* (2013.01)

(58) Field of Classification Search
None
See application file for complete search history.

(56) References Cited

U.S. PATENT DOCUMENTS

| | | | |
|---|---|---|---|
| 7,705,647 B2 * | 4/2010 | Dai | H03K 5/1565 327/170 |
| 8,669,799 B1 | 3/2014 | King | |
| 10,784,847 B1 | 9/2020 | Tandon et al. | |
| 12,126,342 B1 * | 10/2024 | Lin | H03K 5/01 |
| 2015/0323579 A1 | 11/2015 | Im et al. | |
| 2019/0028090 A1 | 1/2019 | Rao et al. | |
| 2019/0131962 A1 | 5/2019 | Jeong et al. | |
| 2019/0272804 A1 | 9/2019 | Amirkhany et al. | |
| 2022/0209751 A1 | 6/2022 | Yang et al. | |
| 2023/0115436 A1 | 4/2023 | Yang et al. | |

* cited by examiner

*Primary Examiner* — Cassandra F Cox
(74) *Attorney, Agent, or Firm* — McClure, Qualey & Rodack, LLP

(57) ABSTRACT

A duty cycle detector includes a current steering network configured to steer a first current into a second current to charge a first capacitor when a clock is in a first state, and to steer the first current into a third current to charge a second capacitor when the clock is in a second state; a first charge sharing switch configured to enable charge sharing between the first capacitor and a third capacitor when the clock is in the second state; a second charge sharing switch configured to enable charge sharing between the second capacitor and a fourth capacitor when the clock is in the first state; a first discharging network configured to discharge the first capacitor when the clock is in a first state; and a second discharging network configured to discharge the second capacitor when the clock is in a second state.

19 Claims, 4 Drawing Sheets

LOW-NOISE SPEEDY DUTY CYCLE DETECTOR AND METHOD THEREOF

BACKGROUND OF THE DISCLOSURE

Field of the Disclosure

The present disclosure generally relates to duty cycle detector and more particularly to speedy duty cycle detectors having low noise.

Description of Related Art

Many modern electronic circuits require a precise clock for proper operation. A clock is a voltage signal that periodically toggles back and forth between a low state and a high state. A percentage of time that the voltage signal stays in the high state is called a duty cycle. Many circuits require a specific duty cycle for a clock to provide an optimal performance, and a duty cycle detector is needed.

Certain prior art duty cycle detection circuits use a lowpass filter to extract a DC level of a clock, which will be proportional to a duty cycle of the clock. To accurately extract the DC level, a corner frequency of the lowpass filter must be small; as a result, it takes a long time to settle and detect the duty cycle. In other words, the duty cycle detector is slow.

Often, an integration circuit is used to generate a voltage of a level proportional to the time that a clock stays in the high state, and therefore proportional to the duty cycle of the clock. An issue is that the integration circuit is subject to generating a low-frequency noise known as a "flicker noise," which is prevalent in semiconductor devices. The low-frequency noise may adversely degrade the accuracy of the duty cycle detection.

What is desired is a low noise, speedy duty cycle detector.

BRIEF DESCRIPTION OF THIS DISCLOSURE

An objective of this present disclosure is to have a duty cycle detector that can perform a speedy detection of a duty cycle of a clock.

Another objective of this present disclosure is to have a duty cycle detector that can mitigate circuit noise.

In an embodiment, a method of duty cycle detection comprises: receiving a clock that cyclically alternates between an even cycle and an odd cycle; using a current source to output a first current; steering the first current onto a first capacitor and enabling charge sharing between a second capacitor and a fourth capacitor when the clock is in a first state during the even cycle; steering the first current onto the second capacitor and enabling charge sharing between the first capacitor and a third capacitor when the clock is in a second state during the even cycle; discharging the first capacitor and enabling charge sharing between the second capacitor and the fourth capacitor when the clock is in the first state during the odd cycle; and discharging the second capacitor and enabling charge sharing between the first capacitor and the third capacitor when the clock is in the second state during the odd cycle.

In an embodiment, a duty cycle detector comprises: a current steering network configured to steer a first current into a second current to charge a first capacitor when a clock is in a first state during an even cycle, and to steer the first current into a third current to charge a second capacitor when the clock is in a second state during the even cycle; a first charge sharing switch configured to enable charge sharing between the first capacitor and a third capacitor when the clock is in the second state; a second charge sharing switch configured to enable charge sharing between the second capacitor and a fourth capacitor when the clock is in the first state; a first discharging network configured to discharge the first capacitor when the clock is in the first state during the odd cycle; and a second discharging network configured to discharge the second capacitor when the clock is in the second state during the odd cycle.

In an embodiment, a method of duty cycle detection comprises: receiving a clock that cyclically alternates between an even cycle and an odd cycle; using a current source to output a first current; establishing a four-phase sequential and cyclical timing scheme comprising a first phase, a second phase, a third phase, and a fourth phase in accordance with a state of the clock and a state of a phase signal that toggles upon a cycle alternation; steering the first current onto a first capacitor and enabling charge sharing between a second capacitor and a fourth capacitor during the first phase; steering the first current onto the second capacitor and enabling charge sharing between the first capacitor and a third capacitor during the second phase; discharging the first capacitor and enabling charge sharing between the second capacitor and the fourth capacitor during the third phase; and discharging the second capacitor and enabling charge sharing between the first capacitor and the third capacitor during the fourth phase.

DETAILED DESCRIPTION OF THIS DISCLOSURE

Figure 1:
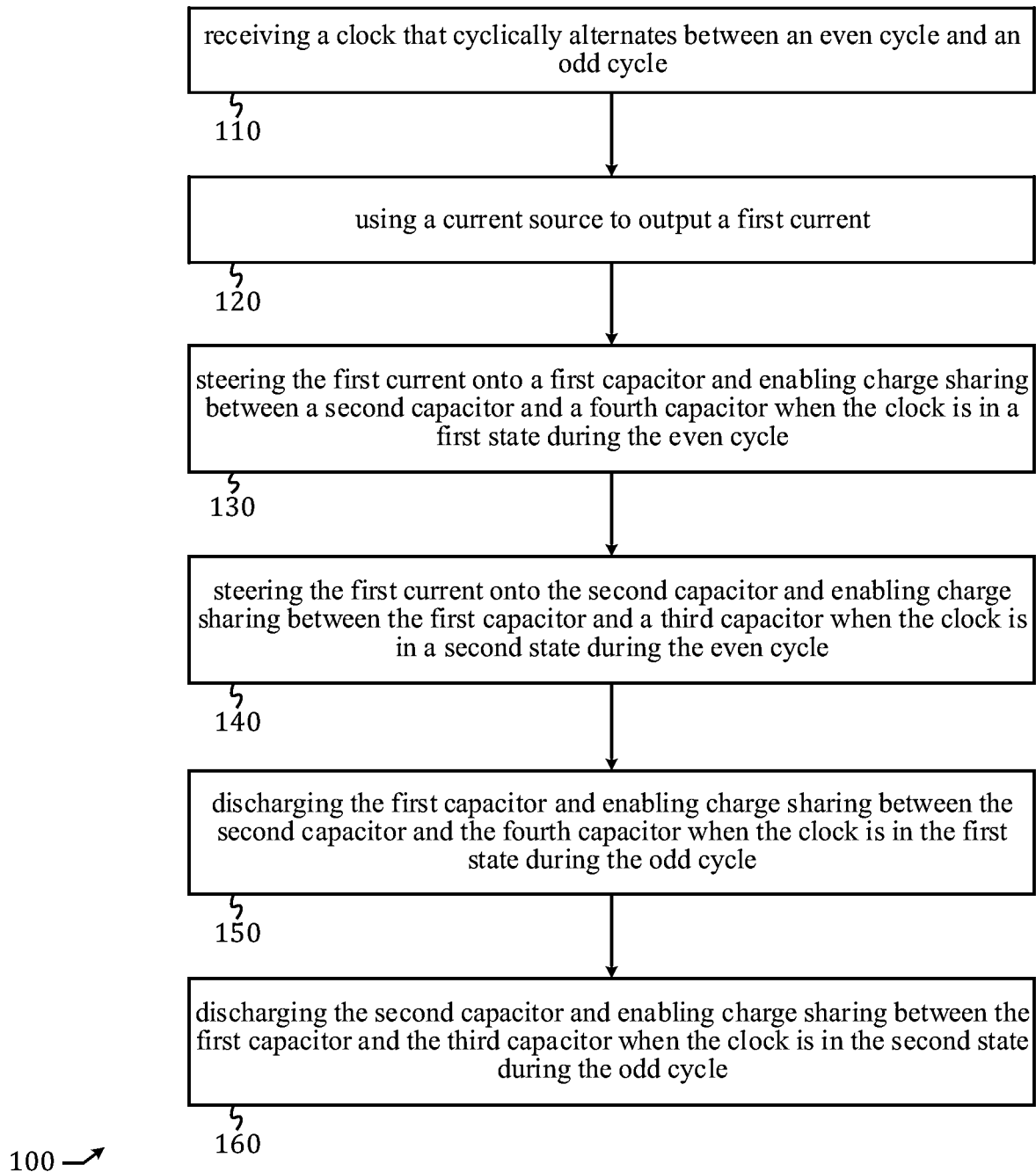
FIG. 1 shows a flow diagram of a method of duty cycle detection in accordance with an embodiment of the present disclosure.

The present disclosure is directed to duty cycle detection. While the specification describes several example embodiments of the disclosure considered favorable modes of practicing the invention, it should be understood that the invention can be implemented in many ways and is not limited to the particular examples described below or to the particular manner in which any features of such examples are implemented. In other instances, well-known details are not shown or described to avoid obscuring aspects of the disclosure.

Persons of ordinary skill in the art understand terms and basic concepts related to microelectronics that are used in this disclosure, such as "voltage," "signal," "capacitor," "CMOS (complementary metal oxide semiconductor)," "PMOS (p-channel metal oxide semiconductor)," "NMOS (n-channel metal oxide semiconductor)," "switch," "lowpass filter," "clock," "period," and "duty cycle." Terms like these are used in the context of microelectronics, and the associated concepts are apparent to those of ordinary skills in the art and thus will not be explained in detail here.

Those of ordinary skill in the art can read a schematic diagram and recognize a switch symbol, an AND gate symbol, a ground symbol, a current source symbol, and a capacitor symbol thereof without the need of a verbose, detailed description.

This present disclosure is disclosed in terms of an engineering sense. For instance, regarding two variables X and Y, when it is said that "X is equal to Y," it means that "X is approximately equal to Y," i.e. "a difference between X and Y is smaller than a specified engineering tolerance." When it is said that "X is zero," it means that "X is approximately zero," i.e. "X is smaller than a specified engineering tolerance." When it is said that "X is substantially smaller than Y," it means that "X is negligible with respect to Y," i.e. "a ratio between X and Y is smaller than an engineering tolerance and therefore X is negligible when compared to Y."

In this present disclosure, a signal is a voltage of a variable level that can vary with time, and a level of the signal at a moment represents a state of the signal at that moment.

A logical signal is a voltage signal of two states: a first state and a second state. In one embodiment, the first state is a high state and the second state is a low state; in another embodiment, the first state is a low state and the second state is a high state. The low state is also referred to as a "0" state, while the high stage is also referred to as a "1" state. Regarding a logical signal Q, "Q is high" or "Q is low" means that "Q is in the high state" or "Q is in the low state." Likewise, "Q is 1" or "Q is 0," means that "Q is in the 1 state" or "Q is in the 0 state."

When a logical signal toggles from low to high, it undergoes a low-to-high transition and exhibits a rising edge. When a logical signal toggles from high to low, it undergoes a high-to-low transition and exhibits a falling edge.

A first logical signal is said to be a logical inversion of a second logical signal, if the first logical signal and the second logical signal are always in opposite states. That is, when the first logical signal is low (i.e., 0), the second logical signal is high (i.e., 1); when the first logical signal is high (i.e., 1), the second logical signal is low (i.e., 0). When a first logical signal is said to be a logical inversion of a second logical signal, the first logical signal and the second logical signal are said to be complementary to each other.

A clock is a logical signal that cyclically toggles back and forth between a low state and a high state. A cycle of a clock starts upon a low-to-high-transition and ends right before a next low-to-high transition.

An inverter receives a first logical signal and outputs a second logical signal such that the second logical signal is a logical inversion of the first signal.

A switch is typically a device of two possible states, "on" and "off." A switch is approximately a short circuit when it is in the "on" state and approximately an open circuit when it is in the "off" state. A switch can be embodied using either a NMOS transistor or a PMOS transistor. When a MOS transistor, either a NMOS transistor or a PMOS transistor, is used to embody a switch, it is controlled by a control signal that is a logical signal applied at a gate of the MOS transistor. A switch embodied by a NMOS transistor is in an "on" state when the control signal is high, and in an "off" state when the control signal is low. A switch embodied by a PMOS transistor is in an "on" state when the control signal is low, and in an "off" state when the control signal is high. In any case, a switch is in an "on" ("off") state when its control signal is asserted (de-asserted). In this present disclosure, when a switch is incorporated, no specific embodiment is specified, and a circuit design can choose to use whatever embodiment known in the prior art at the discretion of the circuit designer.

A circuit is a collection of a transistor, a resistor, and/or other electronic devices inter-connected in a certain manner to embody a certain function. A network is a circuit or a collection of circuits.

As depicted in a flow diagram 100 shown in FIG. 1, a method of duty cycle detection in accordance with an embodiment of the present disclosure comprises the following steps: (step 110) receiving a clock that cyclically alternates between an even cycle and an odd cycle; (step 120) using a current source to output a first current; (step 130) steering the first current onto a first capacitor and enabling charge sharing between a second capacitor and a fourth capacitor when the clock is in a first state during the even cycle; (step 140) steering the first current onto the second capacitor and enabling charge sharing between the first capacitor and a third capacitor when the clock is in a second state during the even cycle; (step 150) discharging the first capacitor and enabling charge sharing between the second capacitor and the fourth capacitor when the clock is in the first state during the odd cycle; and (step 160) discharging the second capacitor and enabling charge sharing between the first capacitor and the third capacitor when the clock is in the second state during the odd cycle.

Figure 2A:
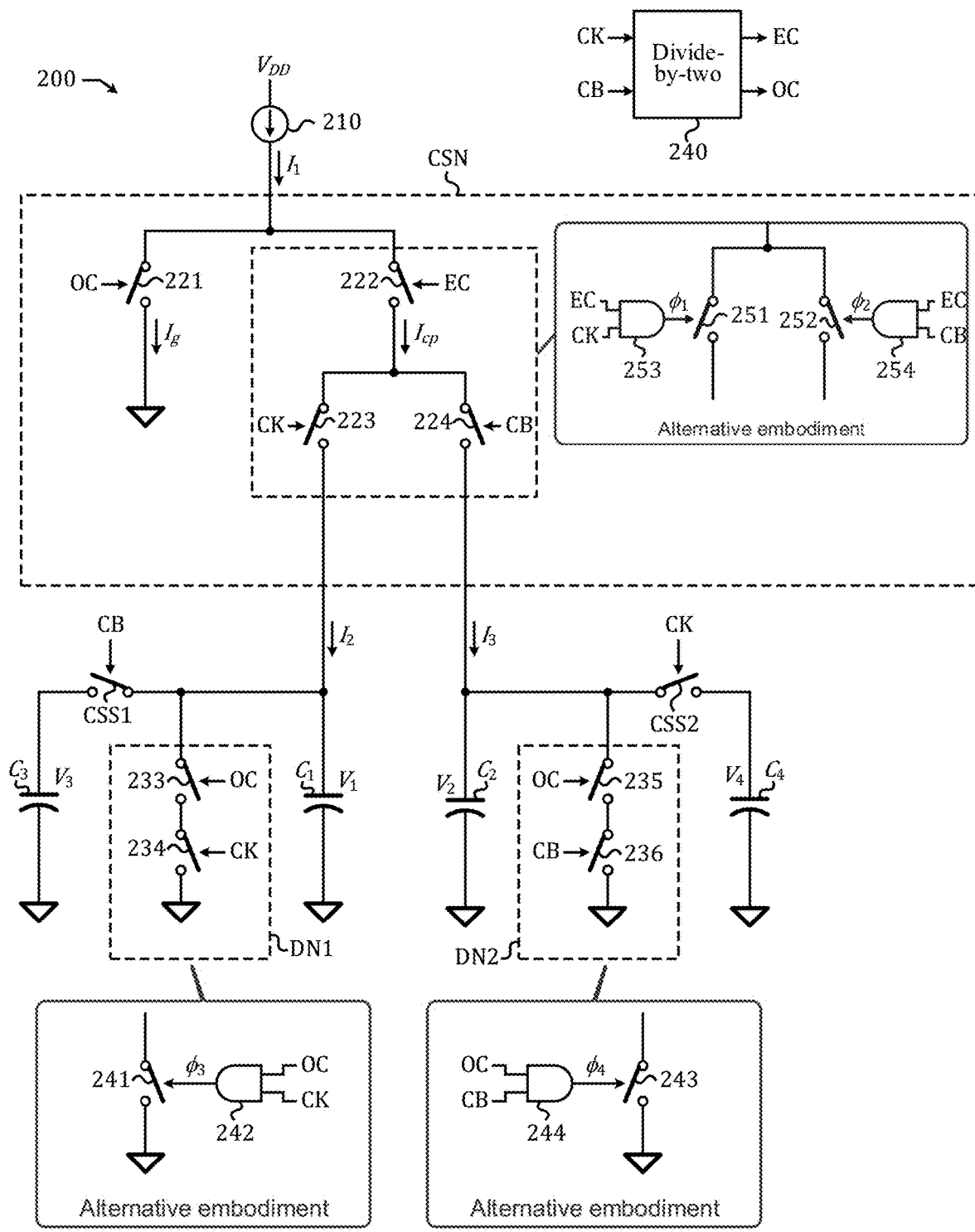
FIG. 2A shows a schematic diagram of a duty cycle detector that embodies the method of duty cycle detection of FIG. 1.

A schematic diagram of a DCD (duty cycle detector) 200, which is an embodiment of the flow diagram 100 shown in FIG. 1, is shown in FIG. 2A. The DCD 200 comprises: a divide-by-two circuit 240 configure to receive a clock CK along with its logical inversion CB and output an even cycle signal EC and an odd cycle signal OC, wherein OC is a logical inversion of the even cycle signal EC; a current source 210 configured to output a first current $I_1$; a current steering network CSN configured to steer the first current $I_1$ into a second current $I_2$ when EC and CK are both high, into a third current $I_3$ when EC and CB are both high, and to ground (as a ground current $I_g$) when OC is high; a first capacitor $C_1$ configured to receive the second current $I_2$; a second capacitor $C_2$ configured to receive the third current $I_3$; a third capacitor $C_3$ configured to share charge with the first capacitor $C_1$ through a first charge-sharing switch CSS1 controlled by CB; a fourth capacitor $C_4$ configured to share charge with the second capacitor $C_2$ through a second charge-sharing switch CSS2 controlled by CK; a first discharging network DN1 configured to discharge the first capacitor $C_1$ when OC and CK are both high; and a second discharging network DN2 configured to discharge the second capacitor $C_2$ when OC and CB are both high.

Figure 2B:
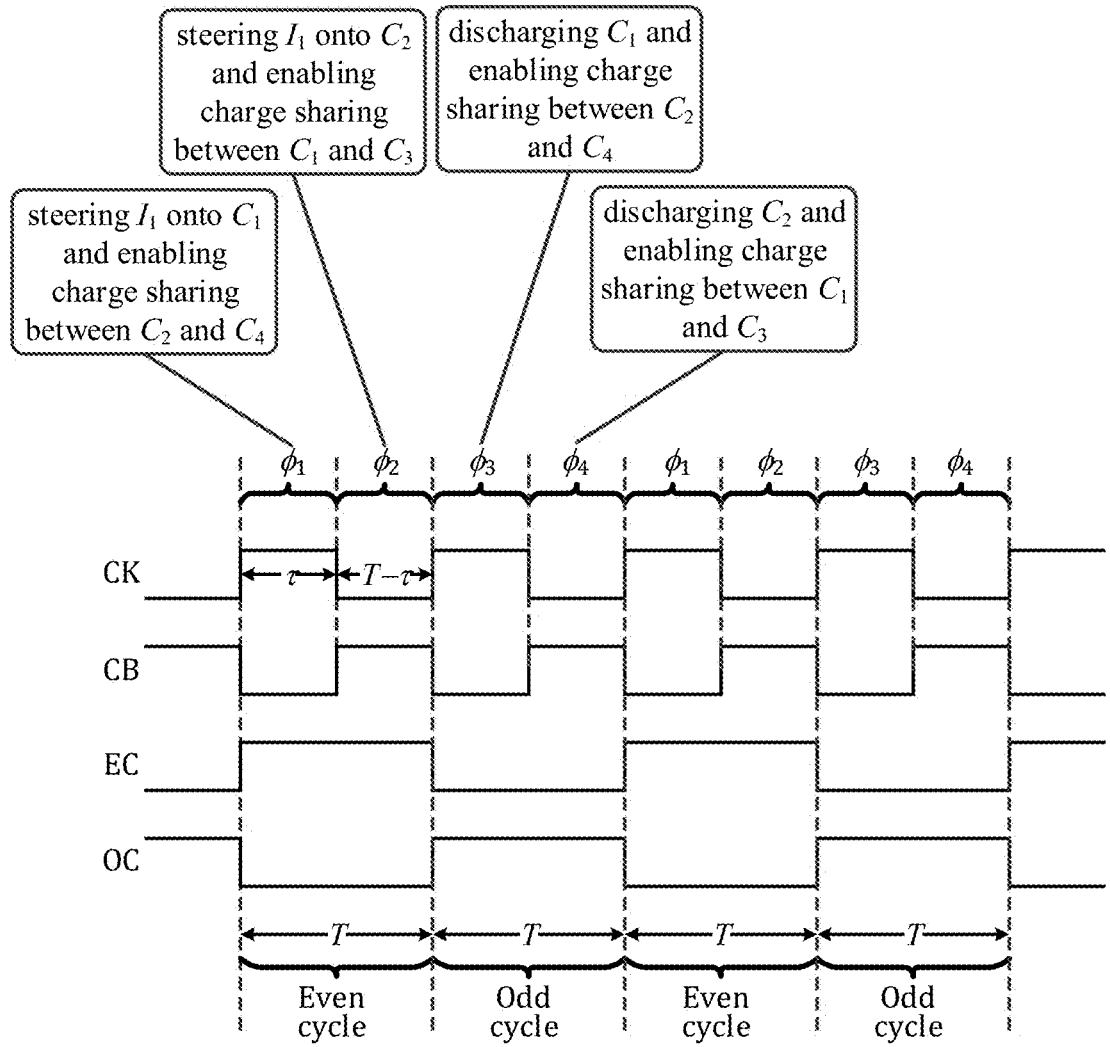
FIG. 2B shows a timing diagram of the duty cycle detector of FIG. 2A.

A timing diagram of the DCD 200 is shown in FIG. 2B. CK is a clock that cyclically toggles back and forth between a high state and a low state. A cycle of CK starts upon a low-to-high transition and ends right before a next low-to-high transition. As is shown, CK cyclically alternates between an even cycle and an odd cycle. A period of CK is T. A pulse width of CK is τ, which is equal to T times a duty cycle of CK. CB is a logical inversion of CK, and consequently a pulse width of CB is T−τ. EC is a divided-by-two clock that toggles back and forth between high and low upon a rising edge of CK. OC is a logical inversion of EC. When EC is high (and OC is low), CK is said to be in an even cycle; when OC is high (and EC is low), CK is said to be in an odd cycle. DCD 200 works cyclically in accordance with CK and EC in a four-phase manner. During a first phase ($\phi_1$) where CK and EC are both high, $I_1$ is steered onto $C_1$ and effectively charges $C_1$ (through CSN) to establish a first voltage $V_1$, while $C_2$ shares charge with $C_4$ (through the second charge sharing switch CSS2); at the end of the first phase, a total charge of $I_1\tau$ is stored on $C_1$ and the first voltage $V_1$ is equal to $I_1\tau/C_1$.

During a second phase ($\phi_2$) where CB and EC are both high, $I_1$ is steered onto $C_2$ and effectively charges $C_2$ (through CSN) to establish a second voltage $V_2$, and $C_1$ shares charge with $C_3$ (through the first charge sharing switch CSS1); at the end of the second phase, a total charge of $I_1(T-\tau)$ is stored on $C_2$ and the second voltage $V_2$ is equal to $I_1(T-\tau)/C_2$. During a third phase ($\phi_3$) where CK and OC are both high, $C_1$ is discharged, and $C_2$ shares charge with $C_4$. During a fourth phase ($\phi_4$) where CB and OC are both high, $C_2$ is discharged, and $C_1$ shares charge with $C_3$. This way, during each 4-phase cycle, the first current $I_1$ alternately charges $C_1$ and $C_2$, of which the charges are subsequently shared with $C_3$ and $C_4$, respectively, and then discharged. At the end, a third voltage $V_3$ at $C_3$ is $I_1\tau/(C_1+C_3)$, or equivalently $I_1(T/2+(\tau-T/2))/(C_1+C_3)$, due to the charge-sharing between $C_1$ and $C_3$, while a fourth voltage $V_4$ at $C_4$ is $I_1(T-\tau)/(C_2+C_4)$, or equivalently $I_1(T/2-(T-\tau/2))/(C_2+C_4)$, due to the charge-sharing between $C_2$ and $C_4$. $C_1$ and $C_2$ are of the same capacitance, while $C_3$ and $C_4$ are of the same capacitance. A difference between $V_3$ and $V_4$ is proportional to $(\tau-T/2)$ and thus proportional to a duty cycle error of CK relative to a 50% duty cycle. Therefore, a duty cycle detection function is achieved.

The divided-by-two circuit 240 can be embodied using a DFF (data flip-flop) that is triggered by the CK (and CB) and configured in a negative feedback topology so that EC (and OC) will toggle state upon a rising edge of CK (and incidentally a falling edge CB); this is well understood by those of ordinary skill in the art and thus not described in detail here.

The charge steering network CSN comprises four switches 221, 222, 223, and 224 controlled by OC, EC, CK, and CB, respectively. The first current $I_1$ is steered into a charge pump current $I_{cp}$ through switch 222 during an even cycle (where EC is high) and into a ground current $I_g$ flowing to ground through switch 221 during an odd cycle (where OC is high). During the even cycle, the charge pump current $I_{cp}$ is further steered into the second current $I_2$ through switch 223 when CK is high, and into the third current $I_3$ through switch 224 when CB is high.

In an alternative embodiment, switches 222, 223, and 224 are removed and replaced by two switches 251 and 252 controlled by the first phase signal $\phi_1$ and the second phase signal $\phi_2$ generated from two AND gates 253 and 254, respectively, wherein the AND gate 253 receives EC and CK and outputs $\phi_1$ while the AND gate 254 receives EC and CB and output $\phi_2$. Functionally, this alternative embodiment fulfills that same function; this is obvious to those of ordinary skill in the art and thus not explained in detail.

The first discharging network DN1 comprises two switches 233 and 234 connected in series, controlled by OC and CK, respectively, and configured to provide a discharge path for $C_1$ when OC and CK are both high. The second discharging network DN2 comprises two switches 235 and 236 connected in series, controlled by OC and CB, respectively, and configured to provide a discharge path for $C_2$ when OC and CB are both high.

In an alternative embodiment, switches 233 and 234 are removed and replaced by switch 241 controlled by the third phase signal $\phi_3$ generated by AND gate 242 in accordance with OC and CK. Likewise, switches 235 and 236 are removed and replaced by switch 243 controlled by the fourth phase signal $\phi_4$ generated by AND gate 244 in accordance with OC and CB. Functionally, this alternative embodiment fulfills that same function; this is obvious to those of ordinary skill in the art and thus not explained in detail.

Thanks to the alternate current steering, a noise of $I_1$ will be stored at both $C_1$ and $C_2$, and later shared with $C_3$ and $C_4$, respectively, and appear as a common-mode noise and can be suppressed when an output is defined by a difference between $V_3$ and $V_4$. This way, an objective of a low-noise duty cycle detection can be fulfilled. Besides, it only takes two cycles of the clock CK to obtain a difference between $V_3$ and $V_4$ that represents a duty cycle error of the clock CK. Therefore, the objective of a speedy duty cycle detection can be fulfilled.

In addition, the charge sharing between $C_1$ and $C_3$ forms a discrete-time (switch-capacitor) lowpass filter that can filter a noise of $I_1$. The same thing can be said about $C_2$ and $C_4$. So, a noise of $I_1$ can be further suppressed by choosing a narrower corner of the discrete-time lowpass filter using a small ratio between $C_1$ and $C_3$ and between $C_2$ and $C_4$ (i.e., smaller value of $C_1/C_3$ and $C_2/C_4$) at the expense of a slower duty cycle detection.

In an embodiment, DCD 200 is integrated and fabricated on a silicon substrate using a CMOS (complementary metal-oxide semiconductor) process technology. The current source 210 can be embodied by a PMOS (p-channel metal-oxide semiconductor) transistor controlled by a bias voltage; this is well understood by those of ordinary skill in the art and thus not explained in detail. A switch can be embodied by an NMOS transistor, a PMOS transistor, or a combination of both; this is also well understood by those of ordinary skill in the art and thus not explained in detail.

Figure 3:
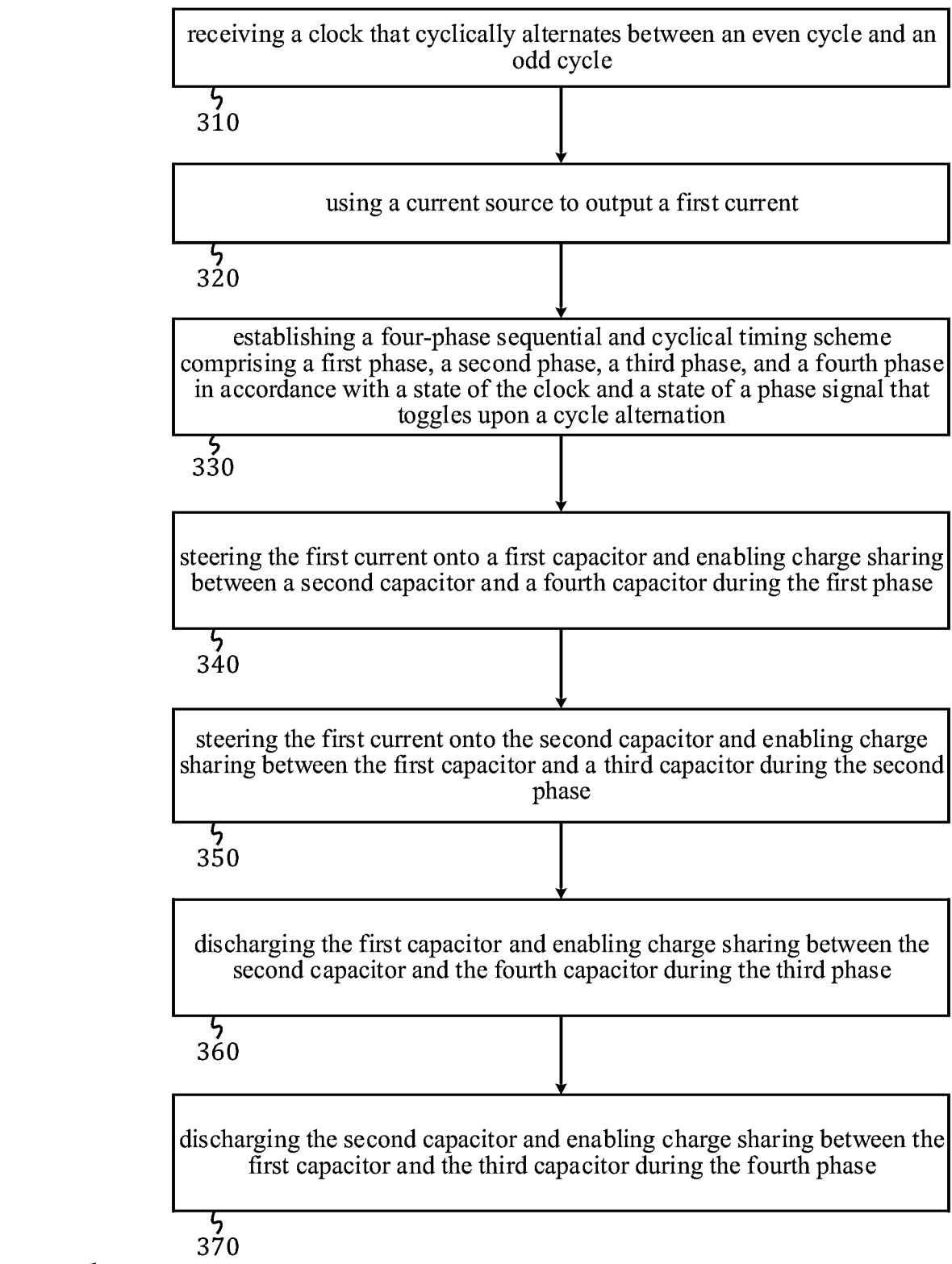
FIG. 3 shows a flow diagram of another method of duty cycle detection in accordance with an embodiment of the present disclosure.

As depicted in FIG. 3, a flow diagram 300 in accordance with another embodiment of the present disclosure comprises the following steps: (step 310) receiving a clock that cyclically alternates between an even cycle and an odd cycle; (step 320) using a current source to output a first current; (step 330) establishing a four-phase sequential and cyclical timing scheme comprising a first phase, a second phase, a third phase, and a fourth phase in accordance with a state of the clock and a state of a cycle signal that toggles upon a cycle alternation; (step 340) steering the first current onto a first capacitor and enabling charge sharing between a second capacitor and a fourth capacitor during the first phase; (step 350) steering the first current onto the second capacitor and enabling charge sharing between the first capacitor and a third capacitor during the second phase; (step 360) discharging the first capacitor and enabling charge sharing between the second capacitor and the fourth capacitor during the third phase; and (step 370) discharging the second capacitor and enabling charge sharing between the first capacitor and the third capacitor during the fourth phase.

Those skilled in the art will readily observe that numerous modifications and alterations of the device and method may be made while retaining the teachings of the disclosure. Accordingly, the above disclosure should not be construed as limited only by the metes and bounds of the appended claims.

What is claimed is:

1. A method of duty cycle detection comprising:
    receiving a clock that cyclically alternates between an even cycle and an odd cycle;
    using a current source to output a first current;
    steering the first current onto a first capacitor and enabling charge sharing between a second capacitor and a fourth capacitor when the clock is in a first state during the even cycle;

steering the first current onto the second capacitor and enabling charge sharing between the first capacitor and a third capacitor when the clock is in a second state during the even cycle;

discharging the first capacitor and enabling charge sharing between the second capacitor and the fourth capacitor when the clock is in the first state during the odd cycle; and discharging the second capacitor and enabling charge sharing between the first capacitor and the third capacitor when the clock is in the second state during the odd cycle.

2. The method of duty cycle detection of claim 1 further comprising generating a cycle signal that toggles upon a cycle transition of the clock such that the clock is in the even cycle when the cycle signal is in the first state and in the odd cycle when the cycle signal is in the second state.

3. The method of duty cycle detection of claim 2, wherein the cycle signal is generated from the clock by using a divide-by-two circuit that performs a divide-by-two function.

4. The method of duty cycle detection of claim 2, wherein enabling the charge sharing between the first capacitor and the third capacitor comprises connecting the first capacitor to the third capacitor through a first charge sharing switch controlled by a logical inversion of the clock.

5. The method of duty cycle detection of claim 4, wherein enabling the charge sharing between the second capacitor and the fourth capacitor comprises connecting the second capacitor to the fourth capacitor through a second charge sharing switch controlled by the clock.

6. The method of duty cycle detection of claim 2, wherein steering the first current onto the first capacitor comprises directing the first current to the first capacitor via a first switch network that gives way to conduction when the cycle signal and the clock are both in the first state.

7. The method of duty cycle detection of claim 6, wherein steering the first current onto the second capacitor comprises directing the first current to the second capacitor via a second switch network that gives way to conduction when the cycle signal is in the first state and the clock is in the second state.

8. The method of duty cycle detection of claim 2, wherein discharging the first capacitor comprises connecting the first capacitor to a ground node via a first switch network that gives way to conduction when the clock is in the first state and the cycle signal is in the second state.

9. The method of duty cycle detection of claim 8, wherein discharging the second capacitor comprises connecting the second capacitor to the ground node via a second switch network that gives way to conduction when both the clock and the cycle signal are in the second state.

10. The method of duty cycle detection of claim 9, wherein the first switch network comprises a serial connection of two switches controlled by the clock and a logical inversion of the cycle signal, respectively, while the second switch network comprises a serial connection of another two switches controlled by a logical inversion of the clock and the logical inversion of the cycle signal, respectively.

11. A duty cycle detector comprising:

a current steering network configured to steer a first current into a second current to charge a first capacitor when a clock is in a first state during an even cycle, and to steer the first current into a third current to charge a second capacitor when the clock is in a second state during the even cycle;

a first charge sharing switch configured to enable charge sharing between the first capacitor and a third capacitor when the clock is in the second state;

a second charge sharing switch configured to enable charge sharing between the second capacitor and a fourth capacitor when the clock is in the first state;

a first discharging network configured to discharge the first capacitor when the clock is in the first state during an odd cycle; and a second discharging network configured to discharge the second capacitor when the clock is in a second state during the odd cycle.

12. The duty cycle detector of claim 11 further comprising a divided-by-two circuit that receives the clock and output a cycle signal that toggles upon a cycle transition of the clock such that the clock is in the even cycle when the cycle signal is in the first state and in the odd cycle when the cycle signal is in the second state.

13. The duty cycle detector of claim 12, wherein the divide-by-two circuit comprises a data flip-flop triggered by the clock and configured in a negative feedback topology such that the cycle signal toggles its state upon a rising edge of the clock.

14. The duty cycle detector of claim 12, wherein the current steering network comprises a first switch controlled by the cycle signal and configured to steer the first current into a charge pump current when the cycle signal is in the first state, a second switch controlled by the clock and configured to steer the charge pump current into the second current when the clock is in the first state, and a third switch controlled by a logical inversion of the clock and configured to steer the charge pump current into the third current when the clock is in the second state.

15. The duty cycle detector of claim 12, wherein the current steering network comprises a first current-steering switch controlled by a first phase signal and configured to steer the first current into the second current, and a second current-steering switch controlled by a second phase signal and configured to steer the first current into the third current, wherein the first phase signal is a first output of a logical AND operation on the clock and the cycle signal, and the second phase signal is a second output of the logical AND operation on a logical inversion of the clock and the cycle signal.

16. The duty cycle detector of claim 12, wherein: the first discharging network comprises two switches connected in series, inserted between the first capacitor and a ground node, and controlled by the clock and a logical inversion of the cycle signal, respectively; and the second discharging network comprises two switches connected in series, inserted between the second capacitor and the ground node, and controlled by a logical inversion of the clock and the logical inversion of the cycle signal, respectively.

17. The duty cycle detector of claim 12, wherein: the first discharging network comprises a first discharging switch inserted between the first capacitor and a ground node, and controlled by a third phase signal that is a first output of a logical AND operation on the clock and a logical inversion of a phase signal; and the second discharging network comprises a second discharging switch inserted between the second capacitor and the ground node, and controlled by a fourth phase signal that is a second output of the logical AND operation on a logical inversion of the clock and the logical inversion of the phase signal.

18. The duty cycle detector of claim 12, wherein the first switch network comprises a serial connection of two switches controlled by a clock signal and a logical inversion of the cycle signal, respectively, while the second switch network comprises a serial connection of another two switches controlled by a logical inversion of the clock signal and the logical inversion of the cycle signal, respectively.

19. A method of duty cycle detection comprising:
receiving a clock that cyclically alternates between an even cycle and an odd cycle;
using a current source to output a first current; establishing a four-phase sequential and cyclical timing scheme comprising a first phase, a second phase, a third phase, and a fourth phase in accordance with a state of the clock and a state of a cycle signal that toggles upon a cycle transition;
steering the first current onto a first capacitor and enabling charge sharing between a second capacitor and a fourth capacitor during the first phase;
steering the first current onto the second capacitor and enabling charge sharing between the first capacitor and a third capacitor during the second phase;
discharging the first capacitor and enabling charge sharing between the second capacitor and the fourth capacitor during the third phase; and
discharging the second capacitor and enabling charge sharing between the first capacitor and the third capacitor during the fourth phase.

* * * * *